(12) United States Patent
Iino et al.

(10) Patent No.: US 11,574,827 B2
(45) Date of Patent: Feb. 7, 2023

(54) SUBSTRATE PROCESSING APPARATUS AND SUBSTRATE PROCESSING METHOD

(71) Applicant: Tokyo Electron Limited, Tokyo (JP)

(72) Inventors: Tadashi Iino, Kumamoto (JP); Yoshihiro Kai, Kumamoto (JP); Yoichi Tokunaga, Kumamoto (JP); Nobuhiro Ogata, Kumamoto (JP); Jiro Higashijima, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 339 days.

(21) Appl. No.: 16/641,713

(22) PCT Filed: Aug. 17, 2018

(86) PCT No.: PCT/JP2018/030547
§ 371 (c)(1),
(2) Date: Feb. 25, 2020

(87) PCT Pub. No.: WO2019/044548
PCT Pub. Date: Mar. 7, 2019

(65) Prior Publication Data
US 2020/0357667 A1 Nov. 12, 2020

(30) Foreign Application Priority Data

Aug. 29, 2017 (JP) .............................. JP2017-164584

(51) Int. Cl.
*H01L 21/67* (2006.01)
*H01L 21/304* (2006.01)
(Continued)

(52) U.S. Cl.
CPC ...... *H01L 21/67253* (2013.01); *H01L 21/304* (2013.01); *H01L 21/306* (2013.01);
(Continued)

(58) Field of Classification Search
None
See application file for complete search history.

(56) References Cited

U.S. PATENT DOCUMENTS

2007/0107498 A1* 5/2007 Thotadakumbri ... G01N 29/022
73/53.01
2014/0202496 A1* 7/2014 Miyagi ............... H01L 21/6704
134/99.1
(Continued)

FOREIGN PATENT DOCUMENTS

JP 2003-092343 A 3/2003

OTHER PUBLICATIONS

International Search Report dated Oct. 23, 2018 for WO 2019/044548 A1.

*Primary Examiner* — Xiaoming Liu
(74) *Attorney, Agent, or Firm* — Venjuris, P.C.

(57) ABSTRACT

A substrate processing apparatus includes: a processing unit including a holder that holds a substrate and rotates the substrate, a nozzle that ejects a processing liquid, and a conductive piping unit that supplies the processing liquid to the nozzle; a controller that causes the processing unit to execute a liquid processing in which the substrate is processed by supplying the processing liquid from the nozzle to the substrate that is held and rotated by the holder, and a measuring unit that measures a flowing current generated by the processing liquid flowing through the piping unit. The controller monitors the liquid processing based on a measurement result by the measuring unit.

16 Claims, 10 Drawing Sheets

(51) Int. Cl.
  *H01L 21/306* (2006.01)
  *H01L 21/687* (2006.01)
(52) U.S. Cl.
  CPC .... *H01L 21/6708* (2013.01); *H01L 21/67051* (2013.01); *H01L 21/68764* (2013.01)

(56) References Cited

U.S. PATENT DOCUMENTS

2015/0153691 A1* 6/2015 Ono .................... G03G 15/553
  399/33
2017/0087575 A1* 3/2017 Hashima ............. H01L 21/6708

* cited by examiner

| WAFER TYPE | NUMBER OF ROTATION | LIQUID TYPE | TEMPERATURE | ... | FLOWING CURRENT |
|---|---|---|---|---|---|
| A | 500 rpm | DIW | ROOM TEMPERATURE | ... | X1 uA |
| A | 1000 rpm | SC1 | Y1 degC | ... | X2 uA |
| ... | ... | ... | ... | ... | ... |
| B | 500 rpm | DIW | ROOM TEMPERATURE | ... | X3 uA |
| ... | ... | ... | ... | ... | ... |

SUBSTRATE PROCESSING APPARATUS AND SUBSTRATE PROCESSING METHOD

CROSS REFERENCE TO RELATED APPLICATIONS

This application is a national phase of PCT application No. PCT/JP2018/030547, filed on 17 Aug. 2018, which claims priority from Japanese patent application No. 2017-164584, filed on 29 Aug. 2017, all of which are incorporated herein by reference.

TECHNICAL FIELD

Exemplary embodiments disclosed herein relate to a substrate processing apparatus and a substrate processing method.

BACKGROUND

In the related art, a substrate processing apparatus has been known, which processes a substrate by ejecting a processing liquid from a nozzle disposed above the substrate to the substrate such as a semiconductor wafer (see, e.g., Patent Document 1).

PRIOR ART DOCUMENT

Patent Document

Patent Document 1: Japanese Patent Laid-Open Publication No. 2003-092343

SUMMARY OF THE INVENTION

Problem to be Solved

In this type of a substrate processing apparatus, a weak current called a "flowing current" is occurred by a processing liquid flowing through a conductive piping unit, but in the related art, it is not considered measuring such a flowing current and using it effectively for processing a substrate.

An aspect of an embodiment is to provide a substrate processing apparatus and a substrate processing method capable of measuring a flowing current and using it effectively for processing a substrate.

Means to Solve the Problem

A substrate processing apparatus according to an aspect of an embodiment includes a processing unit, a controller, and a measuring unit. The processing unit includes a holder that holds and rotates a substrate, a nozzle that ejects a processing liquid, and a conductive piping unit that supplies the processing liquid to the nozzle. The controller causes the processing unit to execute a liquid processing in which the substrate is processed by supplying the processing liquid from the nozzle to the substrate that is held and rotated by the holder. The measuring unit measures a flowing current generated by the processing liquid flowing through the piping unit. Further, the controller monitors the liquid processing based on a measurement result by the measuring unit.

Effect of the Invention

According to an aspect of the embodiment, it is possible to measure the flowing current and effectively use it for processing the substrate.

DETAILED DESCRIPTION TO EXECUTE THE INVENTION

Hereinafter, exemplary embodiments of a substrate processing apparatus and a substrate processing method disclosed herein will be described in detail with reference to the accompanying drawings. Further, the present disclosure is not limited to the following exemplary embodiments.

First Embodiment (1. Configuration of Substrate Processing System)

First, descriptions will be made on a configuration of a substrate processing system according to a first embodiment with reference to FIG. 1.

Figure 1:
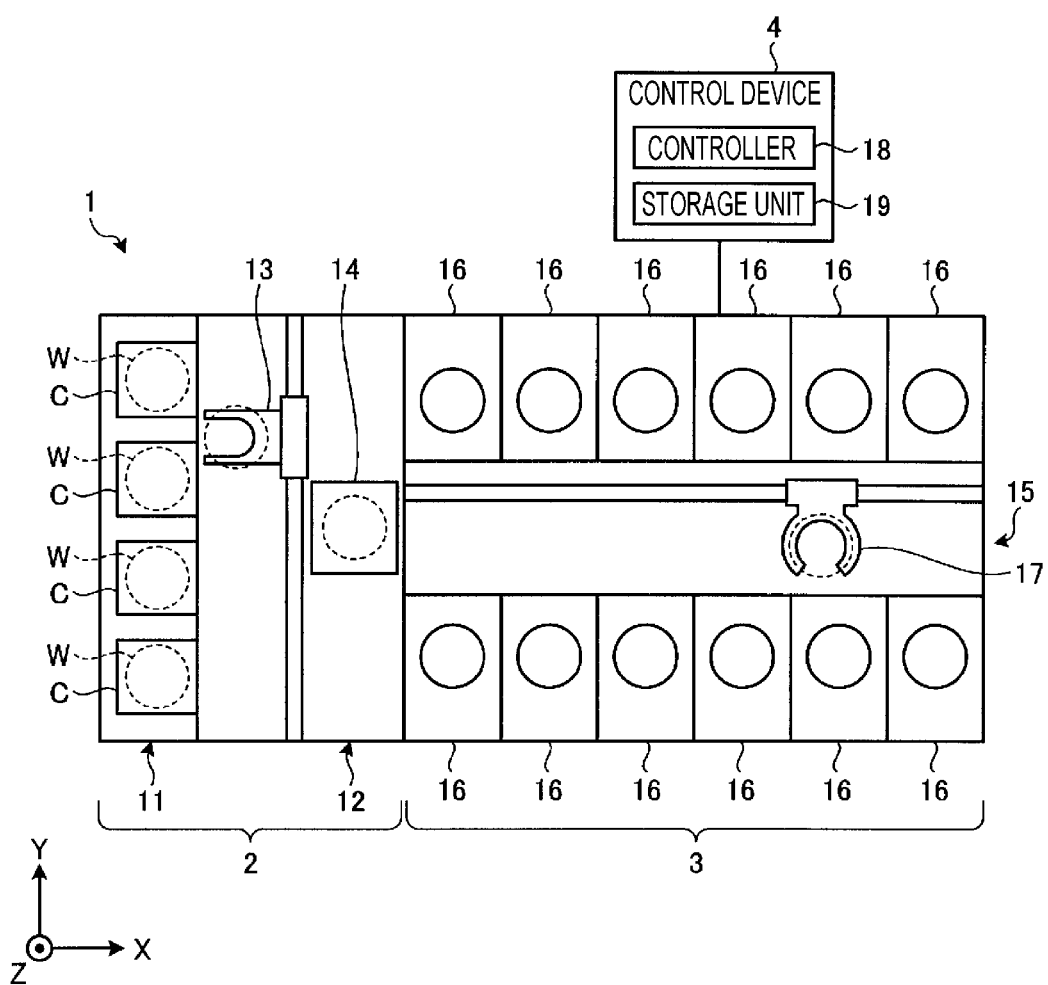
FIG. 1 is a view illustrating a schematic configuration of a substrate processing system according to an embodiment.

FIG. 1 is a view illustrating a schematic configuration of a substrate processing system according to an embodiment. In the following, in order to clarify positional relationships, the X-axis, the Y-axis, and the Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates, i.e., semiconductor wafers (hereinafter, "wafers W") in the present embodiment, horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis. The transfer device 13 transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disk (HD), a flexible disk (FD), a compact disk (CD), a magnet optical disk (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3, and carried into the processing unit 16.

The wafer W carried into the processing unit 16 is processed by the processing unit 16, and then, carried out from the processing unit 16 and placed on the delivery unit 14 by the substrate transfer device 17. Then, the processed wafer W, which is placed on the delivery unit 14, is returned to the carrier C of the carrier placing section 11 by the substrate transfer device 13.

The controller 18 of the control device 4 includes a microcomputer having a central processing unit (CPU), a read only memory (ROM), a random access memory (RAM), an input/output port, and the like, and various circuits. The CPU of this microcomputer reads out and executes the program recorded in the ROM to implement control described later.

Further, the program may be recorded in a computer-readable recording medium, and installed from the recording medium to the storage unit 19 of the control device 4. The computer-readable recording medium may be, for example, a hard disk (HD), a flexible disk (FD), a compact disk (CD), a magnet optical disk (MO), or a memory card.

The storage unit 19 of the control device 4 is implemented by, for example, a semiconductor memory element such as a RAM or a flash memory, or a storage device such as a hard disk or an optical disk.

(2. Configuration of Processing Unit)

Figure 2:
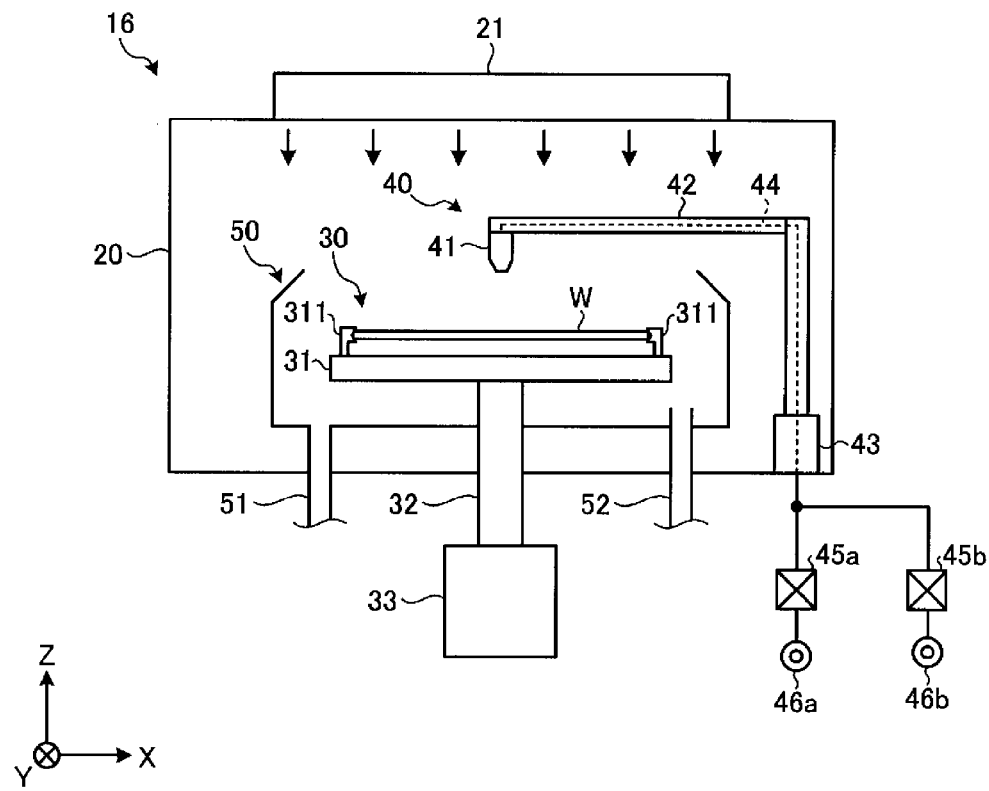
FIG. 2 is a view illustrating a schematic configuration of a processing unit.

Subsequently, descriptions will be made on a configuration of the processing unit 16 with reference to FIG. 2. FIG. 2 is a view illustrating a schematic configuration of the processing unit 16.

As illustrated in FIG. 2, the processing unit 16 is provided with a chamber 20, a substrate holding mechanism 30, a processing liquid supply 40, and a recovery cup 50.

The chamber 20 accommodates the substrate holding mechanism 30, the processing liquid supply 40, and the recovery cup 50. A fan filter unit (FFU) 21 is provided on the ceiling of the chamber 20. The FFU 21 forms a down flow within the chamber 20.

The substrate holding mechanism 30 is provided with a holder 31, a pillar 32, and a driving unit 33. The holder 31 is provided substantially at the center of the chamber 20. A holding member 311 is provided on the upper surface of the holder 31 to hold the wafer W from the lateral side. The wafer W is held horizontally in a state of being slightly spaced apart from the upper surface of the holder 31 by the holding member 311. The pillar 32 is a vertically extending member, and has a base end portion supported rotatably by the driving unit 33 and a tip end portion supporting the holder 31 horizontally. The driving unit 33 is configured to have, for example, a motor, and rotates the pillar 32 around a vertical axis.

The substrate holding mechanism 30 rotates the pillar 32 by using the driving unit 33, so that the holder 31 supported by the pillar 32 is rotated, and hence, the wafer W held in the holder 31 is rotated.

The processing liquid supply 40 supplies a processing liquid onto the wafer W. The processing liquid supply 40 includes a nozzle 41 that ejects the processing liquid, an arm 42 that horizontally supports the nozzle 41, and a moving mechanism 43 that pivots and moves the arm 42 up and down. The moving mechanism 43 is able to move the nozzle 41 along a diametrical direction (i.e., along the horizontal direction) of the wafer W by pivoting the arm 42.

The nozzle 41 is connected with a conductive piping unit 44. The piping unit 44 is connected with a chemical liquid supply source 46a via a valve 45a, and with a rinse liquid supply source 46b via a valve 45b. The piping unit 44 is a resin based tube in which a plurality of conductive layers is formed in a stripe shape along the longitudinal direction.

The processing liquid supply 40 is configured as described above, and a chemical liquid supplied from the chemical liquid supply source 46a is ejected from the nozzle 41 to the wafer W through the piping unit 44 by opening the valve 45a. Further, a rinse liquid supplied from the rinse liquid supply source 46b is ejected from the nozzle 41 to the wafer W through the piping unit 44 by opening the valve 45b.

Here, an example is illustrated in which SC1 (a mixed solution of ammonia, hydrogen peroxide, and water) is used as a chemical liquid, and DIW (deionized water at room temperature (20☐ to 25☐) which is not heated) is used as a rinse liquid. However, the types of the chemical liquid and the rinse liquid are not limited to the above example. Further, the processing liquid supply 40 may be configured to supply various types of chemical liquids. SC1, which serves as a chemical liquid, is ejected from the nozzle 41 in a state of being heated to a predetermined temperature (e.g., 80☐) by a heater (not illustrated).

The recovery cup 50 is disposed to surround the holder 31, and collects the processing liquid scattered from the wafer W by the rotation of the holder 31. A drain port 51 is formed on the bottom of the recovery cup 50, and the processing liquid collected by the recovery cup 50 is released from the drain port 51 to the outside of the processing unit 16. Further, an exhaust port 52 is formed on the bottom of the recovery cup 50 to release a gas supplied from the FFU 21 to the outside of the processing unit 16.

(3. Contents of Liquid Processing)

Subsequently, contents of the liquid processing performed in the processing unit 16 will be described. Here, the liquid processing is performed according to the control of the controller 18 of the control device 4.

In the processing unit 16, first, a carry-in processing of the wafer W is performed. In the carry-in processing, the processing unit 16 holds the wafer W carried into the chamber 20 by the substrate transfer device 17 (see, FIG. 1) using the holding member 311 of the substrate holding mechanism 30.

Subsequently, a chemical liquid processing is performed in the processing unit 16. In the chemical liquid processing, the processing unit 16 first rotates the holder 31 using the driving unit 33, thereby rotating the wafer W held by the holder 31 at a predetermined rotation number. Subsequently, the processing unit 16 positions the nozzle 41 above the center of the wafer W using the moving mechanism 43.

After that, the processing unit 16 opens the valve 45a for a predetermined time to supply SC1 from the nozzle 41 to the surface of the rotating wafer W. The SC1 ejected to the wafer W is spread over the entire surface of the wafer W by a centrifugal force attended by the rotation of the wafer W. Therefore, the wafer W is processed (e.g., cleaned).

Subsequently, a rinse processing is performed in the processing unit 16. In the rinse processing, the processing unit 16 opens the valve 45b for a predetermined time to supply DIW from the nozzle 41 to the surface of the rotating wafer W. The DIW ejected to the wafer W is spread over the entire surface of the wafer W by a centrifugal force attended by the rotation of the wafer W. Therefore, the SC1 remaining on the wafer W is washed out with the DIW.

Subsequently, a drying processing is performed in the processing unit 16. In the drying processing, the processing unit 16 increases the rotation speed of the driving unit 33, so that the DIW on the wafer W is scattered, and thereby drying the wafer W.

Subsequently, a carry-out processing is performed in the processing unit 16. In the carry-out processing, the processing unit 16 stops the rotation of the wafer W caused by the driving unit 33, and then, delivers the wafer W to the substrate transfer device 17. When the carry-out processing is completed, a series of substrate processings on one wafer W is completed.

(4. Flowing Current)

When the processing liquid flows through a conductive piping such as the piping unit 44, a current called a flowing current is generated. The flowing current is a current that is generated when charges existing on a liquid side of an electric double layer generated at a contact interface between solids and liquids are separated from charges on a solid side by the flow of the liquids.

Since the flowing current is a weak current, it cannot be normally measured without using a special device such as a picoammeter. However, the inventors of the present disclosure have found that, in the liquid processing described above, when supplying the processing liquid from the nozzle 41 to the rotating wafer W, a flowing current, which is larger than a normal flowing current, flows. This is considered because the flow of the processing liquid is increased in speed by flowing on the wafer W rotating at a high speed (e.g., 500 rpm to 2000 rpm), and thus, the amount of the generated flowing current increases. Therefore, it is possible to measure the flowing current generated during the chemical liquid processing or the rinse processing without using a special device such as a picoammeter.

Figure 3:
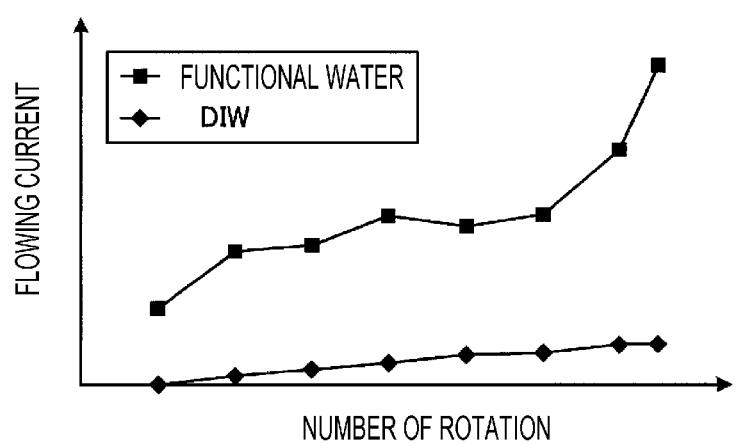
FIG. 3 is a graph illustrating a result of measuring a value of a flowing current during a liquid processing while changing the number of rotations of a wafer.

The present inventors have found that the value of the flowing current changes when the processing conditions (the number of rotations, the type of the processing liquid, or the like) of the liquid processing change. Descriptions will be made in this regard with reference to FIG. 3. FIG. 3 is a graph illustrating a result of measuring a value of the flowing current during the liquid processing while changing the number of rotations of the wafer W.

In FIG. 3, the value of the flowing current in a case where functional water is supplied from the nozzle 41 to the rotating wafer W is illustrated by a square plot, and the value of the flowing current in a case where DIW is supplied is illustrated by a diamond-shaped plot. The functional water is a liquid having a larger amount of ions than DIW.

As illustrated in FIG. 3, the value of the flowing current increases as the number of rotations of the wafer W increases. Further, the value of the flowing current is different between the DIW and the functional water, and the value of the flowing current is larger in functional water having a larger amount of ions.

As described above, the value of the flowing current generated during the liquid processing changes in accordance with the processing conditions of the liquid processing. Therefore, in the substrate processing system 1 according to the embodiment, the flowing current during the liquid processing is measured, and the monitoring of the liquid processing is performed based on the measurement result. Hereinafter, detailed descriptions will be made in this regard.

(5. Configuration of Conduction Path)

Figures 4, 5:
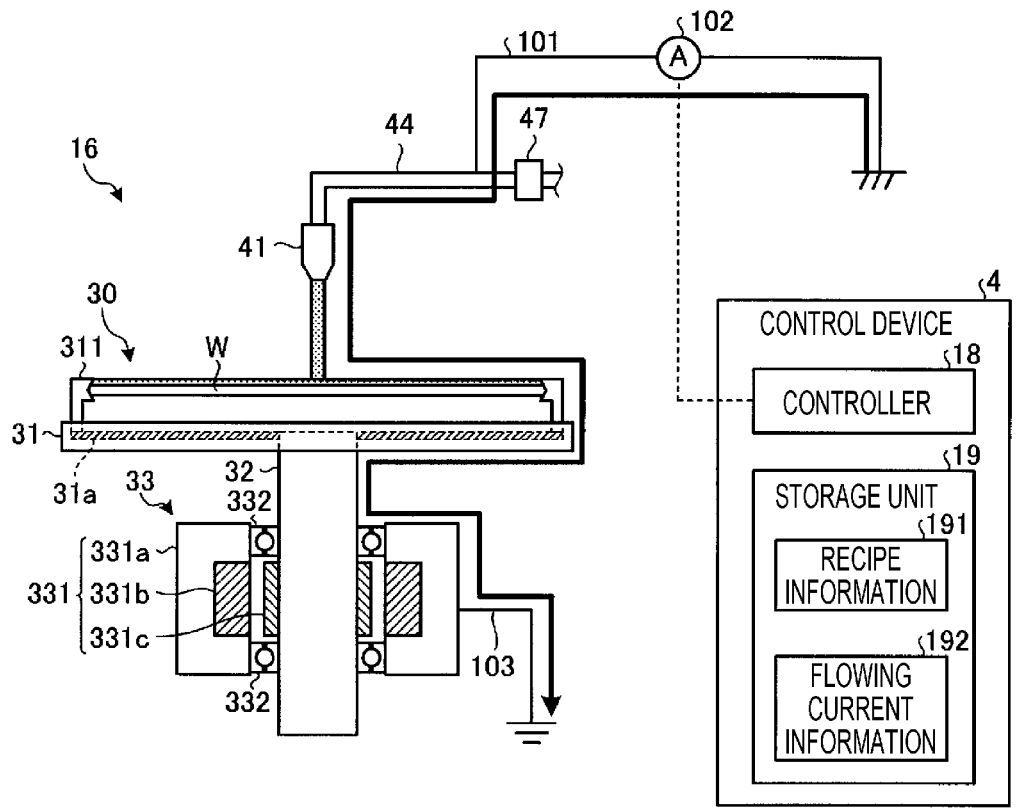
FIG. 4 is a view illustrating a configuration of a conduction path of the flowing current.
FIG. 5 is a view illustrating an example of flowing current information.

First, a conduction path of the flowing current will be described with reference to FIG. 4. FIG. 4 is a view illustrating a configuration of the conduction path of the flowing current.

As illustrated in FIG. 4, the processing unit 16 is provided with a wiring 101 for connecting the conductive piping unit 44 to the ground. An insulating joint 47 is provided at the piping unit 44, and the flowing current described above is generated by the processing liquid flowing through the piping unit 44 on the downstream side from the insulating joint 47. One end of the wiring 101 is connected to the piping unit 44 on the downstream side from the insulating joint 47, and the other end is connected to the ground.

The holding member 311 of the processing unit 16 is made of a conductive member. For example, the holding member 311 is made using a conductive resin such as PEEK containing a carbon fiber. Further, a conductive member 31a that is in contact with the holding member 311 and the pillar 32 is provided inside the holder 31. The pillar 32 is made of a conductive member as well.

The driving unit 33 of the processing unit 16 includes an electric motor 331 and a plurality (here, two) of bearings 332. The electric motor 331 includes a housing 331a, a stator 331b, and a rotor 331c.

The housing 331a is formed as, for example, a cylindrical shape, and houses the stator 331b and the rotor 331c therein. The housing 331a is made of a conductive member. The stator 331b is provided on an inner peripheral surface of the housing 331a. The rotor 331c is disposed on an inner peripheral side of the stator 331b to face each other with a gap. The rotor 331c is provided on an outer peripheral surface of the pillar 32 to face the stator 331b.

The bearings 332 are provided between the housing 331a and the pillar 32, and rotatably support the pillar 32. A bearing 332 is, for example, a ball bearing, which is made of a conductive member.

The housing 331a of the driving unit 33 is connected with a wiring 103 for connecting the electric motor 331 to the ground. One end of the wiring 103 is connected to the housing 331a, and the other end is connected to the ground.

As described above, the conduction path of the flowing current is constituted by the wiring 101, the piping unit 44, the nozzle 41, the processing liquid and the wafer W, the holding member 311, the conductive member 31a of the holder 31, the pillar 32, the bearings 332, the housing 331a of the electric motor 331, and the wiring 103. Then, the flowing current flows from the wiring 101 to the wiring 103 as illustrated in an arrow in FIG. 4.

A measuring unit 102 configured to measure the flowing current is provided in the wiring 101. The measuring unit 102 is an ammeter capable of measuring a current at a microampere level. The measuring unit 102 measures the flowing current during the liquid processing described above, and outputs the measurement result to the controller 18. The measuring unit 102 may measure the flowing current in at least the chemical liquid processing and the rinse processing among the liquid processing described above, and does not necessarily need to measure the flowing current during the entire period of the liquid processing.

Meanwhile, the storage unit 19 of the control device 4 stores recipe information 191. The recipe information 191 is information in which respective processing conditions of the liquid processing executed by the processing unit 16 are registered in the processing sequence. Specifically, the recipe information 191 includes the processing conditions such as the number of rotations of the wafer W, the type of the processing liquid, or the temperature of the processing liquid in each processing. The controller 18 controls the processing unit 16 according to such recipe information 191 to cause the processing unit 16 to execute the liquid processing described above.

Further, the storage unit 19 stores flowing current information 192. The flowing current information 192 is information in which the processing conditions of the liquid processing and the value of the flowing current are associated. Here, descriptions will be made on the contents of the flowing current information 192 with reference to FIG. 5. FIG. 5 is a view illustrating an example of the flowing current information 192.

As illustrated in FIG. 5, the flowing current information 192 includes a "wafer type" item, a "rotation number" item, a "liquid type" item, a "temperature" item, or the like as the processing conditions of the liquid processing. In the "wafer type" item, information indicating the type of the wafer W is stored. In the "rotation number" item, information indicating the number of rotations of the wafer W is stored. In the "liquid type" item, information indicating the type of the processing liquid is stored. In the "temperature" item, information indicating the temperature of the processing liquid is stored.

(6. Monitoring of Liquid Processing based on Measurement Result of Flowing Current)

(6.1. Abnormality Detection)

The controller 18 monitors the liquid processing based on the measurement result of the flowing current by the measuring unit 102. For example, the controller 18 may detect an abnormality of the liquid processing based on the measurement result of the flowing current obtained from the measuring unit 102, and the recipe information 191 and the flowing current information 192 stored in the storage unit 19.

Figure 6:
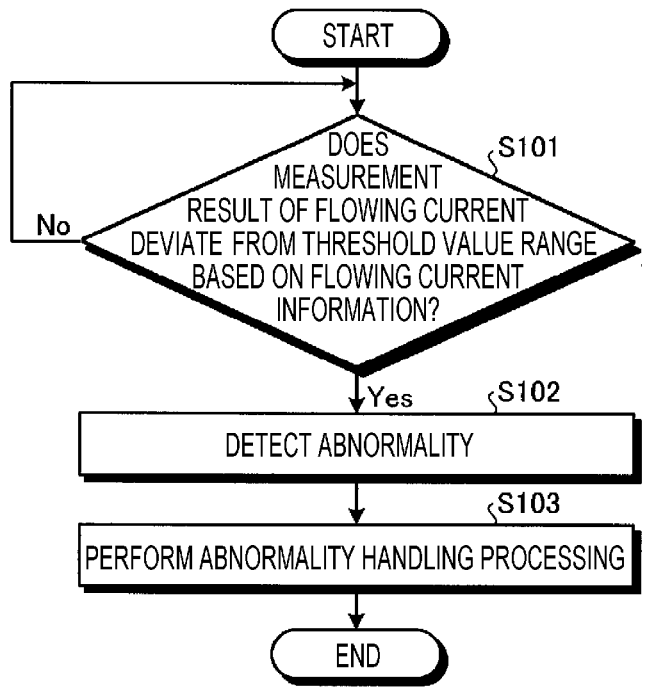
FIG. 6 is a flow chart illustrating a processing procedure of an abnormality detection processing.

Descriptions will be made on this abnormality detection processing with reference to FIG. 6. FIG. 6 is a flow chart illustrating a processing procedure of the abnormality detection processing. The abnormality detection processing illustrated in FIG. 6 is performed, for example, in the liquid processing, from the start of the chemical liquid processing to the end of the rinse processing.

As illustrated in FIG. 6, the controller 18 determines whether or not the measurement result of the flowing current by the measuring unit 102 deviates from the threshold range based on the value of the flowing current included in the flowing current information 192 (step S101).

For example, according to the recipe information 191, when performing the chemical processing on a wafer W of the wafer type "A" with the number of rotations of "1000 rpm," the liquid type of "SC1," and the temperature of "Y1 degC," the controller 18 determines whether or not the measurement result of the flowing current during the chemical liquid processing deviates from the threshold range with "X2 µA" as a reference, for example, the range of ±10% with respect to X2 µA.

In step S101, when the measurement result of the flowing current falls within the threshold range based on the value of the flowing current includes in the flowing current information 192 (No, in step S101), the controller 18 repeats the determination processing in step S101. Meanwhile, when it is determined that the measurement result of the flowing current deviates from the threshold range (Yes, in step S101), the controller 18 detects an abnormality of the liquid processing (step S102).

For example, when the conduction path illustrated in FIG. 4 is interrupted in a midway, the value of the flowing current decreases and may deviate from the threshold range. Therefore, when the measurement result of the flowing current is below the threshold range, the controller 18 may detect at least one of the "rupture of the piping unit 44," "breakage of the wafer W," or "insulation of the holder 31 or the holding member 311" as an abnormality of the liquid processing.

Further, the value of the flowing current changes in accordance with the type of the processing liquid. Therefore, when the measurement result of the flowing current deviates from the threshold range, the controller 18 may detect a concentration abnormality of the processing liquid. Further, the value of the flowing current changes in accordance with the temperature of the processing liquid as well. Therefore, when the measurement result of the flowing current deviates from the threshold range, the controller 18 may detect a temperature abnormality of the processing liquid.

Subsequently, the control unit 18 performs an abnormality handling processing (step S103). For example, the controller 18 may stop the liquid processing, and turn ON an indicator light provided in the substrate processing system 1. Further, the controller 18 may output abnormality information to a host device connected to the substrate processing system 1 via a network.

(6.2. Discharge Detection)

Figure 7:
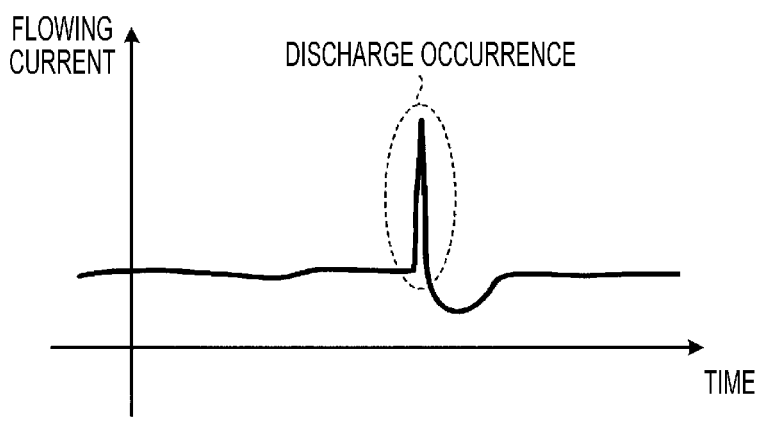
FIG. 7 is an explanatory view of a discharge detection processing.

Discharge may occur during the chemical liquid processing or the rinse processing. For example, when potential difference between the chemical liquid or the rinse liquid ejected from the nozzle 41 and the wafer W is large, discharge may occur at the moment when the chemical liquid or the rinse liquid is brought into contact with the wafer W. When discharge occurs, the value of the flowing current abruptly changes. Therefore, the controller 18 may detect the occurrence of discharge by detecting the abrupt change of the flowing current. Descriptions will be made in this regard with reference to FIG. 7. FIG. 7 is an explanatory view of a discharge detection processing. The graph in FIG. 7 illustrates an example of a change of the flowing current over time during the chemical processing or the rinse processing.

As illustrated in FIG. 7, when discharge occurs during the chemical liquid processing or the rinse processing, an abrupt change appears in the measurement result of the flowing current. The controller 18 stores the measurement result by the measuring unit 102 during the chemical liquid processing and the rinse processing in the storage unit 19, and calculates the amount of change of the flowing current using the measurement result stored in the storage unit 19. Then, when the amount of change of the flowing current exceeds the threshold value, the controller 18 detects the occurrence of discharge.

As described above, the controller 18 is able to detect the occurrence of discharge during the chemical liquid processing or the rinse processing, based on the measurement result by the measuring unit 102.

(6.3. Detection of Completion Timing of Replacement of Liquid)

Figure 8:
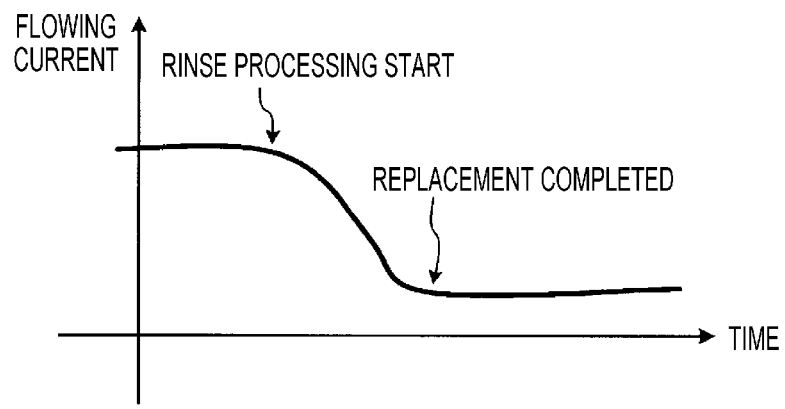
FIG. 8 is an explanatory view of a detection processing of a completion timing of replacement of a processing liquid.

The controller 18 is able to detect a completion timing of replacement of the processing liquid based on the measurement result by the measuring unit 102. Descriptions will be made in this regard with reference to FIG. 8. FIG. 8 is an explanatory view of a detection processing of a completion timing of replacement of the processing liquid. The graph in FIG. 8 illustrates an example of a change of the flowing current over time during the transition from the chemical processing to the rinse processing.

For example, since DIW used in the rinse processing has a smaller amount of ions than SC1 used in the chemical liquid processing, the flowing current generated during the rinse processing becomes small as compared with the flowing current generated during the chemical liquid processing. Therefore, as illustrated in FIG. 8, when performing the rinse processing after the chemical liquid processing, the flowing current is gradually decreased after starting of the rinse processing, and is stabilized by completing the replacement of SC1 with DIW.

The controller 18 stores the measurement result by the measuring unit 102 during the rinse processing in the storage unit 19, and calculates the amount of change of the flowing current using the measurement result stored in the storage unit 19. Then, when the amount of change of the flowing current is below the threshold value, the controller 18 detects the completion of the replacement of SC1 (an example of the first processing liquid) with DIW (an example of the second processing liquid).

As described above, the processing time of the rinse processing may be optimized by detecting the completion timing of the replacement of the processing liquid. That is, the rinse processing may be ended at the completion timing of the replacement with DIW. The controller 18 may update the recipe information using the detection result of the completion timing of the replacement.

The controller 18 may perform the detection processing of the completion timing of the replacement of the processing liquid, based on the measurement result of the flowing current and flowing current information 192. For example, when the measurement result of the flowing current during the rinse processing is the value of the flowing current during the rinse processing indicated in the flowing current information 192, or falls within a predetermined range (e.g., ±10%) based on the value of the flowing current indicated in the flowing current information 192, the completion of the replacement of SC1 with DIW may be detected. Further, when the measurement result of the flowing current during the rinse processing falls within the value of the flowing current during the rinse processing indicated in the flowing current information 192 or within the predetermined range, and the amount of change of the measurement result of the flowing current is below the threshold value, the controller 18 may detect the completion of the replacement of SC1 with DIW.

(6.4. Estimation of Charge Amount of Wafer)

Figure 9:
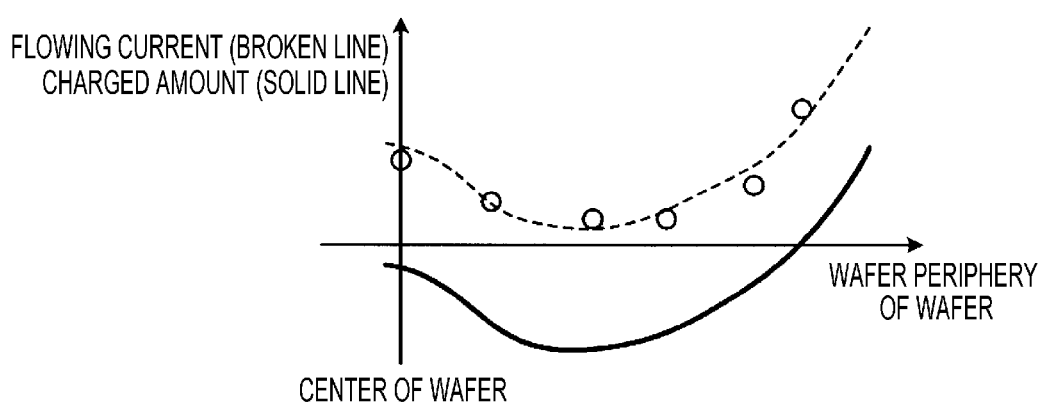
FIG. 9 is an explanatory view of a charge amount estimation processing.

The controller 18 is able to detect a charge amount of the wafer W based on the measurement result by the measuring unit 102. Descriptions will be made in this regard with reference to FIG. 9. FIG. 9 is an explanatory view of a charge amount estimation processing.

In a graph in FIG. 9, the measurement result of the flowing current at each ejecting position when the ejecting position of the processing liquid is changed between the center of the wafer W and the periphery thereof is illustrated by a broken line, and the measurement result of the charge amount of the wafer W after the liquid processing is illustrated by a solid line. Here, it is assumed that the wafer W is an insulator wafer.

As illustrated in FIG. 9, it may be seen that the measurement result of the flowing current at each ejecting position when the ejecting position of the processing liquid is changed between the center of the wafer W and the periphery thereof illustrates a distribution similar to that of the charge amount of the wafer W after the liquid processing.

In the chemical liquid processing, the controller 18 causes the nozzle 41 to be moved between the center of the wafer W and the periphery thereof using the moving mechanism 43, and causes the processing unit 16 to execute the liquid processing in which the chemical liquid such as SC1 is supplied from the nozzle 41 to the rotating wafer W. Further, the controller 18 involves the measurement result of the flowing current by the measuring unit 102 during the chemical liquid processing with the ejecting position of the chemical liquid and stores it in the storage unit 19 as an estimated charge amount of the wafer W.

Therefore, it is possible to estimate the distribution of the charge amount in the diametrical direction of the wafer W after the liquid processing without separately measuring the charge amount of the wafer W after the liquid processing.

As described above, the substrate processing system 1 according to the first embodiment (an example of the substrate processing apparatus) includes the processing unit 16, the controller 18, and the measuring unit 102. The processing unit 16 includes the holder 31 that holds and rotates the wafer W (an example of the substrate), the nozzle 41 that ejects the chemical liquid and the rinse liquid (an examples of the processing liquid), and the conductive piping unit 44 that supplies the processing liquid to the nozzle 41. The controller 18 causes the processing unit 16 to execute the liquid processing in which the wafer W is processed by supplying the processing liquid from the nozzle 41 to the wafer W that is held and rotated by the holder 31. The measuring unit 102 measures the flowing current generated by the processing liquid flowing through the piping unit 44. Further, the controller 18 monitors the liquid processing based on a measurement result by the measuring unit 102.

Therefore, according to the substrate processing system 1 according to the first embodiment, it is possible to measure the flowing current and use it for processing the substrate.

In the embodiment described above, the example in which a plurality of processing liquids are ejected from the one nozzle 41 has been described, but the processing unit 16 may be configured to include a plurality of nozzles 41 that respectively ejects a plurality of processing liquids. In this case, the wiring 101 and the measuring unit 102 may be provided for the piping unit 44 of each nozzle 41.

Second Embodiment

Figure 10:
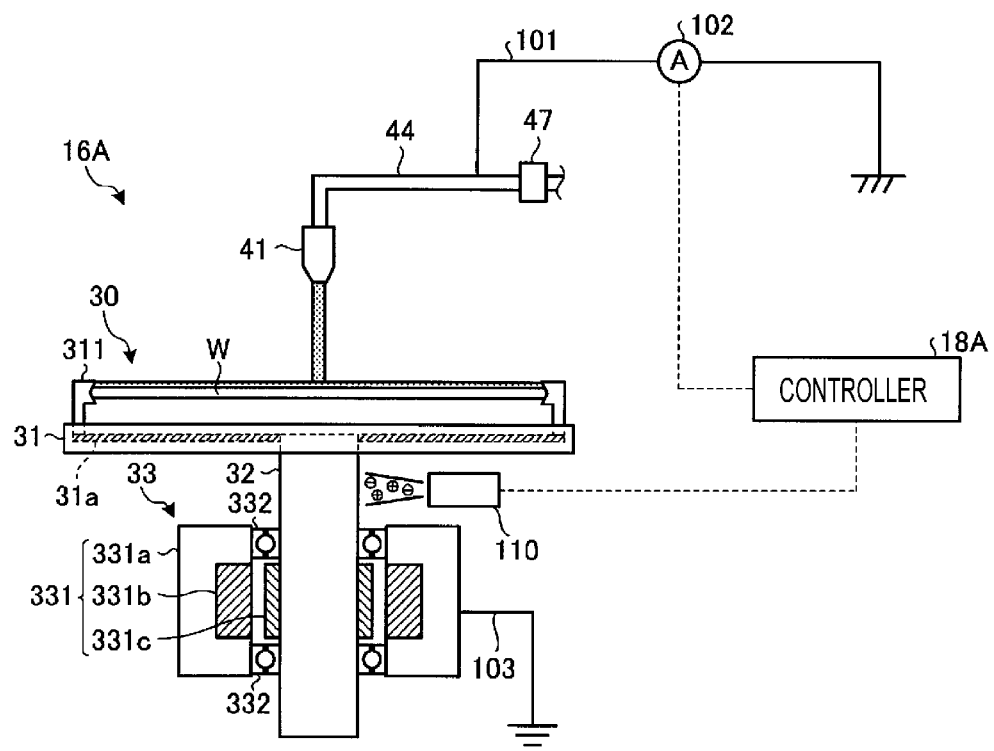
FIG. 10 is a view illustrating a configuration of a processing unit according to a second embodiment.

Subsequently, descriptions will be made on a substrate processing system according to a second embodiment with reference to FIG. 10. FIG. 10 is a view illustrating a configuration of a processing unit according to the second embodiment. In the following descriptions, portions identical to the already described portions will be denoted by the same reference numerals, and redundant descriptions thereof will be omitted.

As illustrated in FIG. 10, a processing unit 16A according to the second embodiment includes an ionizer 110. The ionizer 110 irradiates ions for suppressing the wafer W from being charged to the conduction path of the flowing current. Specifically, the ionizer 110 irradiates ions to the pillar 32.

A controller 18A according to the second embodiment controls an output of the ionizer 110 based on the measurement result of the flowing current during the chemical liquid processing and the rinse processing. Specifically, the controller 18A adjusts the output of the ionizer 110 in accordance with the measurement result by the measuring unit 102 such that the flowing current flowing through the conduction path is decreased, desirably, the flowing current flowing through the conduction path becomes zero. The ions irradiated from the ionizer 110 flows through the conduction path in a direction opposite to the flowing current as an ion current, so as to negate or decrease the flowing current flowing through the conduction path.

As described above, the controller 18A according to the second embodiment may suppress the wafer W from being charged during the chemical liquid processing and the rinse processing, by controlling the output of the ionizer 110 (an example of the current supply) based on the measurement result by the measuring unit 102.

Although the ionizer 110 is used here, a method for negating or decreasing the flowing current is not limited thereto. For example, an external power supply (an example of the current supply) that supplied a current in a direction opposite to the flowing current to the conduction path may be provided in the wiring 101. In this case, the controller 18A may negate or decrease the flowing current flowing through the conduction path by controlling the output of the external power supply based on the measurement result by the measuring unit 102.

Third Embodiment

Figure 11:
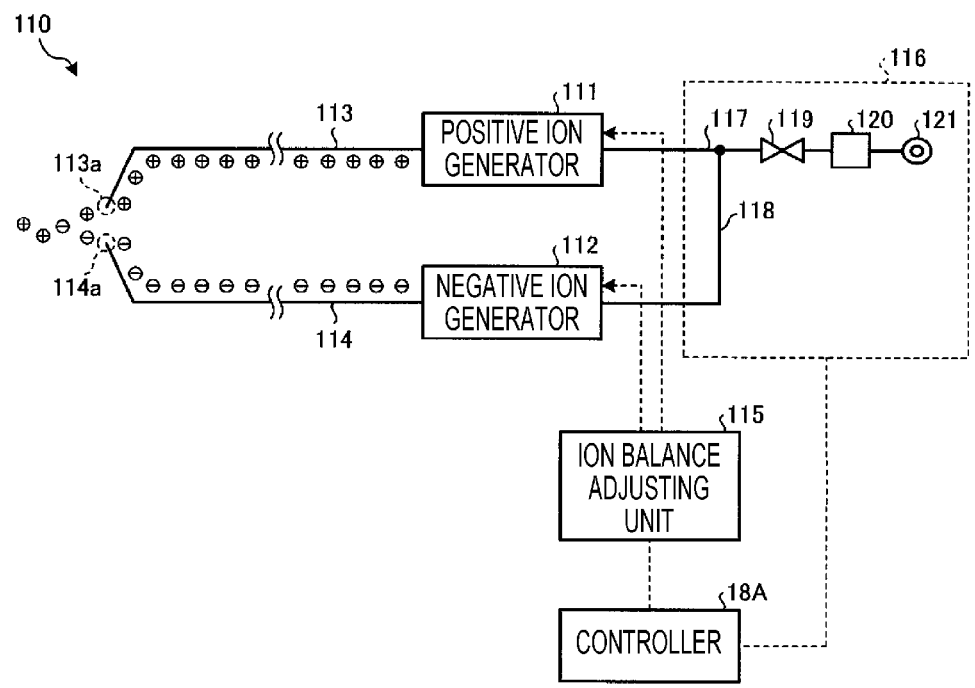
FIG. 11 is a view illustrating a configuration of an ionizer.

In a third embodiment, a specific configuration of the ionizer 110 will be described. FIG. 11 is a view illustrating a configuration of the ionizer 110.

As illustrated in FIG. 11, the ionizer 110 includes a positive ion generator 111, a negative ion generator 112, a positive ion flowing path 113, a negative ion flowing path 114, an ion balance adjusting unit 115, and an airflow generator 116.

The positive ion generator 111 includes a first discharge needle that generates positive ions, and the negative ion generator 112 includes a second discharge needle that generates negative ions. The positive ion flowing path 113 is a piping through which the positive ions generated in the positive ion generator 111 flow, and irradiates the positive ions from a first irradiation port 113a provided at the tip. The negative ion flowing path 114 is a piping through which the negative ions generated in the negative ion generator 112 flow, and irradiates the negative ions from a second irradiation port 114a provided at the tip.

The first irradiation port 113a and the second irradiation port 114a are disposed in the vicinity of a target (pillar 32), and the positive ions irradiated from the first irradiation port 113a and the negative ions irradiated from the second irradiation port 114a are mixed with each other in the vicinity of the target and irradiated to the target. The first irradiation port 113a and the second irradiation port 114a may be disposed close to each other so that the positive ions and the negative ions are easily mixed with each other.

The ion balance adjusting unit 115 adjusts the balance between the positive ions and the negative ions by controlling the positive ion generator 111 and the negative ion generator 112. For example, the ion balance adjusting unit 115 adjusts the voltage applied to the first discharge needle or the second discharge needle, or adjusts the duty ratio of the voltage applied to the first discharge needle or the second discharge needle, and thus, the balance between the positive ions and the negative ions may be adjusted. The controller 18A controls the output of the ionizer 110 by controlling the ion balance adjusting unit 115 of the ionizer 110 based on the measurement result of the flowing current by the measuring unit 102.

As described above, the ionizer 110 generates positive ions and negative ions at separate discharge needles, transports them to the separate flowing paths 113 and 114, mixes with each other immediately before the target, and irradiates the target.

Therefore, when compared with a case where, as in an ionizer in the related art, both positive ions and negative ions are generated using a single discharge needle, and both positive ions and negative ions are transported through a single flowing path to irradiate a target, it is possible to suppress that positive ions and negative ions are combined during the transportation and the amount of ions irradiated to the target is decreased.

Further, since it is possible to suppress the ions from being decreased during the transportation, the ions can be transported to a farther position. In other words, it is possible to dispose the positive ion generator 111 and the negative ion generator 112 which are the ion generating sources at a place away from the target (pillar 32). Therefore, for example, it becomes easy to dispose the positive ion generator 111 and the negative ion generator 112 at a place (e.g., outside the chamber 20) that is not easily affected by the chemical liquid.

Further, only positive ions flow through the positive ion flowing path 113, and only negative ions flow through the negative ion flowing path 114. As a result, in the positive ion flowing path 113, positive ions are transported by the repulsive force of the positive ions, and in the negative ion flowing path 114, negative ions are transported by the repulsive force of the negative ions. Therefore, as in the ionizer in the related art, it is not necessary to use airflow so as to transport positive ions and negative ions. Since airflow is not necessary, it is possible to irradiate positive ions and negative ions to the target without disturbing the airflow in the processing atmosphere.

When it is necessary to transport positive ions and negative ions over a longer distance, the airflow generated by the airflow generator 116 may be used. The airflow generator 116 includes a first supply pipe 117, a second supply pipe 118, a valve 119, a flow rate adjusting unit 120, and a gas supply source 121. One end of the first supply pipe 117 is connected to the positive ion generator 111, and the other end is connected to the gas supply source 121. One end of the second supply pipe 118 is connected to the negative ion generator 112, and the other end is connected to the first supply pipe 117. The valve 119 and the flow rate adjusting unit 120 are provided in the first supply pipe 117 upstream side of the second supply pipe 118. The valve 119 opens/closes the first supply pipe 117, and the flow rate adjusting unit 120 adjusts the flow rate of the gas flowing through the first supply pipe 117. The gas supply source 121 supplies a gas such as air or nitrogen to the first supply pipe 117. The valve 119 and the flow rate adjusting unit 120 of the airflow generator 116 are controlled by the controller 18A.

Figure 12:
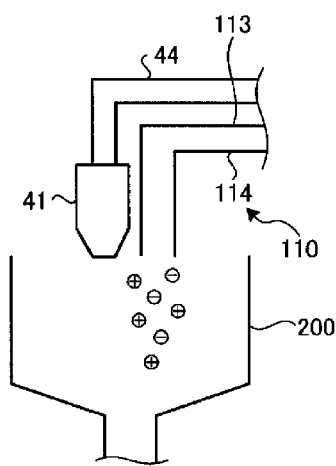
FIG. 12 is a view illustrating an example of a case where the ionizer is used for neutralizing a dummy dispense port.

The ionizer 110 may use a part other than the pillar 32 as a target. For example, the ionizer 110 may be used for neutralizing a dummy dispense port. Descriptions will be made in this regard with reference to FIG. 12. FIG. 12 is a view illustrating an example of a case where the ionizer 110 is used for neutralizing the dummy dispense port.

The dummy dispense port 200 illustrated in FIG. 12 is disposed inside the chamber 20 of the processing unit 16 and 16A, and, during the dummy dispensing of the nozzle 41, receives the chemical liquid ejected from nozzle 41 and releases it to the outside of the chamber 20. The positive ion flowing path 113 and the negative ion flowing path 114 of the ionizer 110 are provided integrally with the nozzle 41 and the piping unit 44. That is, the positive ion flowing path 113 and the negative ion flowing path 114 are moved integrally with the nozzle 41 and the piping unit 44 by the moving mechanism 43.

When the dummy dispense port 200 is charged, a droplet of the chemical liquid ejected from nozzle 41 is absorbed by the dummy dispense port 200 and remains in the dummy dispense port 200. Then, when another chemical liquid comes into contact with the chemical liquid remained in the dummy dispense port 200, salt or particles may be generated.

Therefore, during the dummy dispensing of the nozzle 41, the dummy dispense port 200 may be neutralized by respectively irradiating positive ions and negative ions to the dummy dispense port 200 from the positive ion flowing path 113 and the negative ion flowing path 114 of the ionizer 110.

Further, the ionizer 110 may irradiate positive ions and negative ions to the nozzle 41. Also in this case, the positive ion flowing path 113 and the negative ion flowing path 114 of the ionizer 110 are provided integrally with the nozzle 41 and the piping unit 44.

When ejecting the chemical liquid from the nozzle 41, the droplet of the chemical liquid may be adhered around the ejection port of the nozzle 41 due to electricity. Therefore, the nozzle 41 may be neutralized by respectively irradiating positive ions and negative ions to the nozzle 41 from the positive ion flowing path 113 and the negative ion flowing path 114 of the ionizer 110. Therefore, it is possible to suppress the adhering of the droplet to the nozzle 41. The irradiation of positive ions and negative ions may always be performed, or may be performed only during the chemical liquid processing and the rinse processing.

Fourth Embodiment

In a fourth embodiment, a method for measuring a surface potential of the wafer W will be described.

In the related art, when measuring the surface potential of the wafer W, a surface electrometer that measures the surface potential of the wafer W using a probe disposed above the wafer W has been used. However, when disposing the probe above the wafer W, a chemical liquid or the like may be adhered to the probe and deteriorate the probe. Further, when the wafer W is carried into/out from the chamber 20 or the nozzle 41 is moved, the probe may disturb. Further, the airflow by the FFU 21 may be disturbed by the probe. Moreover, it is easy to be affected by charged materials other than the wafer W, so that it is difficult to accurately measure the surface potential of the wafer W. As described above, in the related art, there is a room for further improvement in efficiently measuring the surface potential of the wafer W during the liquid processing.

Meanwhile, the surface potential of a conductor is constant, and thus, the measurement result is the same regardless of where the surface potential of the conductor is measured. Therefore, in the fourth embodiment, the surface potential of the wafer W is measured by measuring the surface potential of the place electrically connected to the wafer W other than the wafer W.

Figure 13:
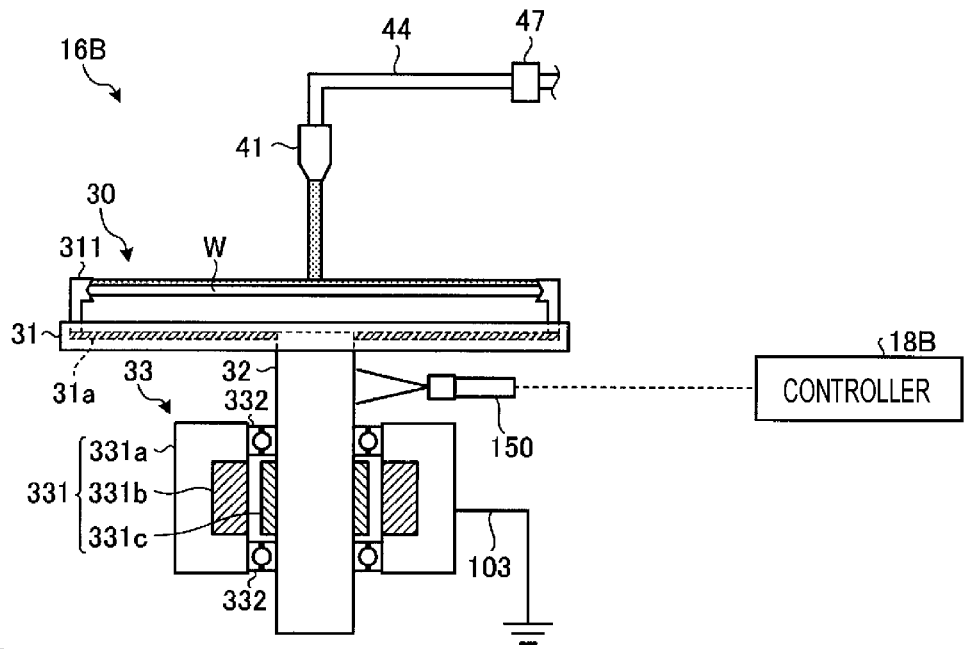
FIG. 13 is a view illustrating a configuration of a processing unit according to a fourth embodiment.

FIG. 13 is a view illustrating a configuration of a processing unit according to the fourth embodiment. As illustrated in FIG. 13, a processing unit 16B according to the fourth embodiment includes a surface electrometer 150. During the liquid processing, the surface electrometer 150 measures the surface potential of the pillar 32 of the driving unit 32, and outputs the measurement result to the controller 18B.

Here, the neutralization path for neutralizing the substrate, specifically, the wafer W, the holding member 311, the conductive member 31a of the holder 31, the pillar 32, the bearing 332, the housing 331a of the electric motor 331, and the wiring 103 may have a low resistance. However, the resistance value of the bearing 332 that forms a portion of the neutralization path is increased as the number of rotations of the wafer W is increased. This is because, as the number of rotation increases, an oil film is formed around a ball of the bearing 332, and the bearing floats from a raceway surface, thereby becoming closer to an insulating state. Therefore, when the number of rotations of the wafer W increases during the liquid processing, the resistance value of the neutralization path increases, and thus, the surface potential of the wafer W is increased.

As described above, the resistance value of the bearing 332 increases during the rotation of the wafer W, a portion upstream side of the bearing 332 in the neutralization path, that is, the wafer W, the holding member 311, the conductive member 31a of the holder 31, and the pillar 32 may be regarded as one conductor. Therefore, it is possible to indirectly measure the surface potential of the wafer W by measuring the surface potential of the pillar 32 by the surface electrometer 150.

In the example illustrated in FIG. 13, the surface potential of a portion of the pillar 32 positioned between the holder 31 and the bearing 332 is measured by the surface electrometer 150. By disposing the surface electrometer 150 in that place, it is possible to prevent a chemical liquid or the like from being adhered to the surface electrometer 150. Further, when the wafer W is carried into/out from the chamber 20 or the nozzle 41 is moved, the surface electrometer 150 does not disturb, and the airflow by the FFU 21 is not disturbed. Moreover, since it is difficult to be affected by charged materials other than the wafer W, the surface potential of the wafer W may be measured more accurately.

In order to make it difficult to be affected by charged materials other than the wafer W, the surface electrometer 150 may be covered with a metal box.

Figure 14:
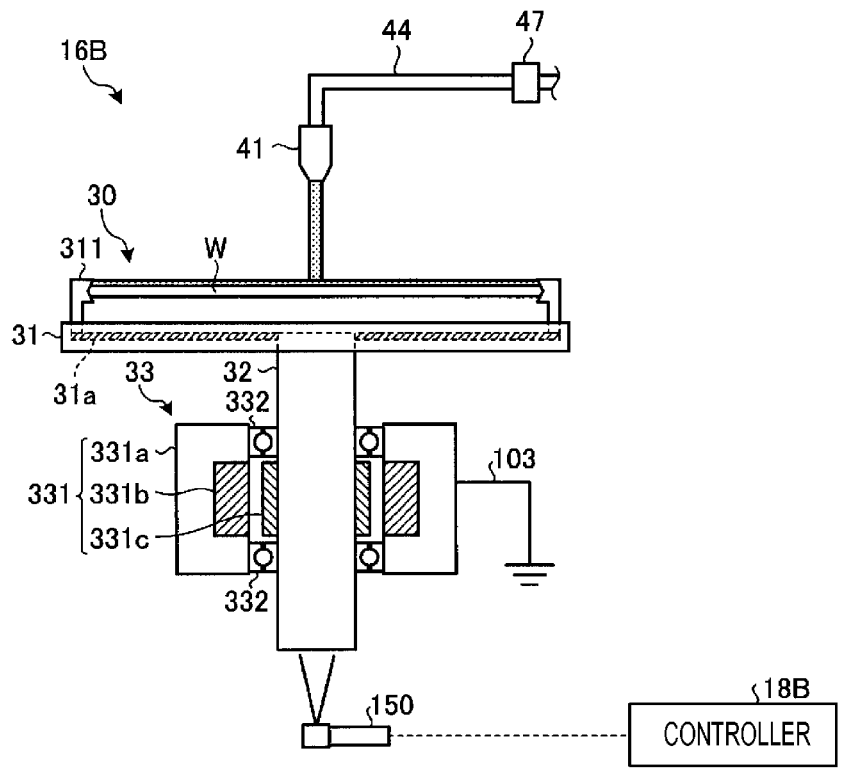
FIG. 14 is a view illustrating another example of a measuring position of a surface potential by a surface electrometer.
Figure 15:
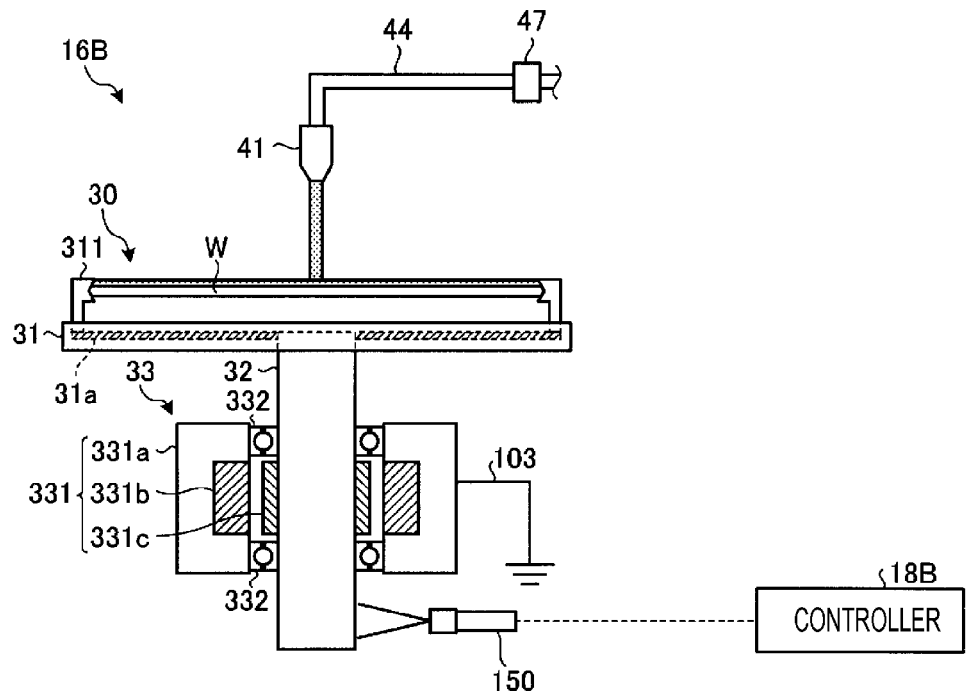
FIG. 15 is a view illustrating still another example of a measuring position of the surface potential by the surface electrometer.

Here, descriptions will be made on other examples of the measuring position of the surface potential by the surface electrometer 150 with reference to FIGS. 14 and 15. FIGS. 14 and 15 are views illustrating other examples of the measuring position of the surface potential by the surface electrometer 150.

As illustrated in FIGS. 14 and 15, the surface electrometer 150 may measure the surface potential of a portion below the bearing 332 of the pillar 32, that is, the surface potential of a portion extending to the non-loaded portion. An example in which the surface potential of the bottom surface of the pillar 32 is measured is illustrated in FIG. 14, and an example in which the surface potential of the peripheral surface of the pillar 32 is measured is illustrated in FIG. 15. In the example illustrated in FIG. 14, it is not necessary that the pillar 32 is protruded downward from the bearing 332. Further, in FIGS. 14 and 15, in order to make it difficult to be affected by charged materials other than the wafer W, the surface electrometer 150 may be covered with a metal box.

Figure 16:
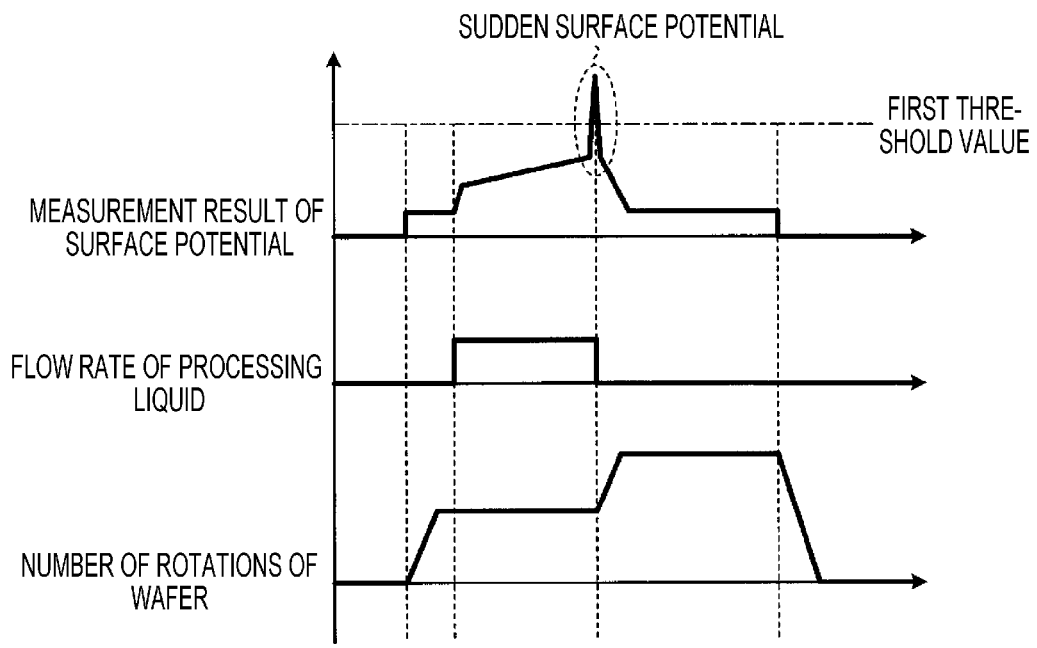
FIG. 16 is an explanatory view of an abnormality detection processing based on a measurement result by the surface electrometer.

Subsequently, descriptions will be made on an example of an abnormality detection processing based on the measurement result by the surface electrometer 150 with reference to FIG. 16. FIG. 16 is an explanatory view of the abnormality detection processing based on the measurement result by the surface electrometer 150. In FIG. 16, during the liquid processing, examples of the measurement result of the surface potential by the surface electrometer 150, the flow rate of the processing liquid ejected from the nozzle 41 to the wafer W, and a change of the number of rotations of the wafer W over time are illustrated.

As illustrated in FIG. 16, the controller 18B may compare the measurement result by the surface electrometer 150 with the first threshold value, and detect the occurrence of an abnormal voltage when the measurement result exceeds the first threshold value. The controller 18B may store the measurement result by the surface electrometer 150 in the storage unit 19, and calculate the change rate of the surface potential using the stored measurement result, and, when the calculated change rate of the surface potential exceeds the threshold value, detect the occurrence of the sudden (pulsed) abnormal voltage.

Figure 17:
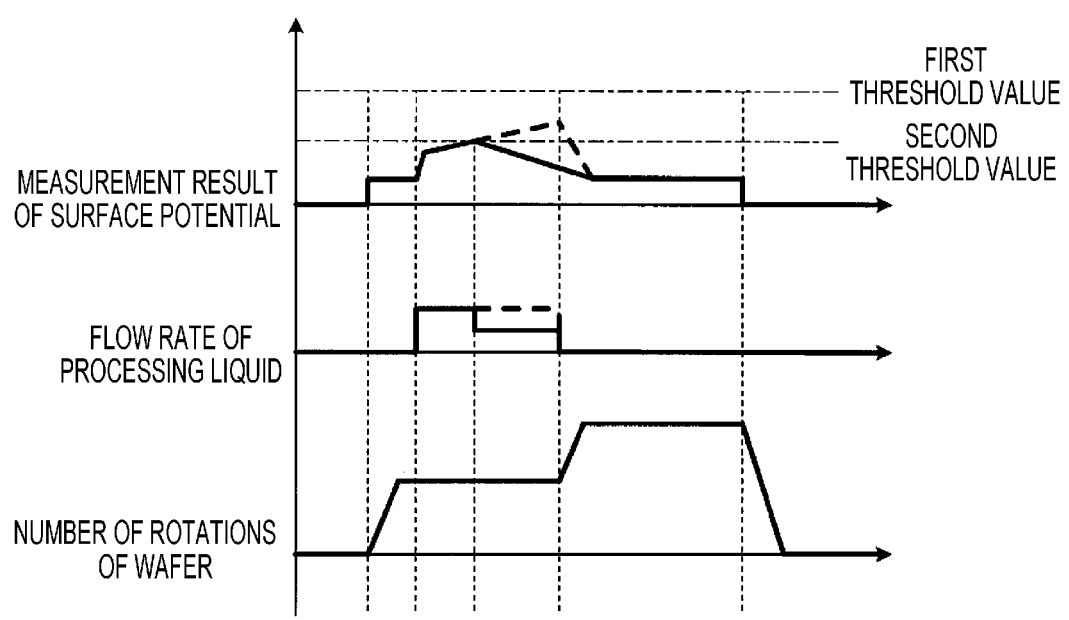
FIG. 17 is an explanatory view of an abnormality handling processing based on the measurement result by the surface electrometer.

Subsequently, descriptions will be made on an example of an abnormality handling processing based on the measurement result by the surface electrometer 150 with reference to FIG. 17. FIG. 17 is an explanatory view of the abnormality handling processing based on the measurement result by the surface electrometer 150. Similar to FIG. 16, in FIG. 17, during the liquid processing, examples of the measurement result of the surface potential by the surface electrometer 150, the flow rate of the processing liquid ejected from the nozzle 41 to the wafer W, and the change of the number of rotations of the wafer W over time are illustrated.

As illustrated in FIG. 17, the controller 18B may compare the measurement result by the surface electrometer 150 with the second threshold value (<first threshold value), and when the measurement result exceeds the second threshold value, control the valve 45a or the valve 45b (see FIG. 2) to decrease the flow rate of the processing liquid ejected from the nozzle 41. Therefore, it is possible to decrease the surface potential of the wafer W. Although the flow rate of the processing liquid is decreased here, the controller 18B may decrease the number of rotations of the wafer W by controlling the driving unit 33 (see FIG. 2). Therefore, it is possible to decrease the surface potential of the wafer W.

As described above, the substrate processing system 1 according to the fourth embodiment (an example of the substrate processing apparatus) includes the conductive holder 31, the neutralization path that comes into contact with the conductive member 31a of the holder 31, and is made of a conductive member, the wiring 103 (an example of the ground) having one end that is connected to the neutralization path and the other end that is connected to the ground potential, the nozzle 41 that ejects the processing liquid to the wafer W held by the holder 31, and the surface electrometer 150 that measures the surface potential of the wafer W held by the holder 31. Further, the neutralization path includes the conductive pillar 32 that is in contact with the conductive member 31a of the holder 31 electrically, and supports the holder 31, the electric motor 331 that supports the pillar 32 via the bearing 332 and rotates the pillar 32. The surface electrometer 150 measures the surface potential of the pillar 32 to measure the surface potential of the wafer W held by the holder 31.

Therefore, according to the substrate processing system 1 according to the fourth embodiment, it is possible to efficiently measure the surface potential of the wafer W during the liquid processing.

Additional effects or modifications may be easily derived by those skilled in the art. For this reason, the broader aspects of the present disclosure are not limited to the specific details and the exemplary embodiments illustrated and described above. Therefore, various modifications may be made without departing from the spirit or scope of the general inventive concept as defined by the appended claims and equivalents thereof.

DESCRIPTION OF SYMBOLS

W: wafer
1: substrate processing system
2: carry-in/out station
3: processing station
4: control device
16: processing unit
18: controller
19: storage unit
101: wiring
102: measuring unit
110: ionizer
191: recipe information
192: flowing current information

What is claimed is:

1. A substrate processing apparatus comprising:
   a processing chamber including a holder configured to hold a substrate and a motor configured to rotate the substrate, a nozzle configured to eject a processing liquid, and a conductive pipe that supplies the processing liquid to the nozzle;
   a first wiring connected to the conductive pipe and including a gauge configured to measure a flowing current generated by the processing liquid flowing through the conductive pipe;
   a second wiring connected to a housing of the motor; and
   a controller configured to control an overall operation of the substrate processing apparatus,
   wherein the controller is configured to:
      supply the processing liquid from the nozzle to the substrate that is held by the holder and rotated by the motor,
      measure a flowing current generated by the processing liquid flowing through the pipe via a conduction path formed between the first wiring and the second wiring using the gauge, and
      monitor a liquid processing based on a measurement result obtained by the gauge.

2. The substrate processing apparatus according to claim 1, further comprising:
   a storage that stores flowing current information in which a processing condition of the liquid processing is associated with a value of the flowing current,
   wherein the controller detects an abnormality of the liquid processing based on the measurement result obtained by the gauge and the flowing current information.

3. The substrate processing apparatus according to claim 2, wherein the controller detects at least one of rupture of the pipe, breakage of the substrate, and insulation of the holder as an abnormality of the liquid processing.

4. The substrate processing apparatus according to claim 3, wherein the flowing current information includes a type of the processing liquid as the processing condition of the liquid processing, and
   the controller detects a concentration abnormality of the liquid processing based on the measurement result obtained by the gauge and the flowing current information.

5. The substrate processing apparatus according to claim 4, wherein the flowing current information includes a temperature of the processing liquid as the processing condition of the liquid processing, and
   the controller detects a temperature abnormality of the liquid processing based on the measurement result obtained by the gauge and the flowing current information.

6. The substrate processing apparatus according to claim 5, wherein the controller detects an occurrence of discharge during the liquid processing based on the measurement result obtained by the gauge.

7. The substrate processing apparatus according to claim 6, wherein the controller detects a timing at which the processing liquid on the substrate is replaced from a first processing liquid to a second processing liquid based on the measurement result obtained by the gauge.

8. The substrate processing apparatus according to claim 7, further comprising:
   a mover that moves the nozzle along a diametrical direction of the substrate,
   wherein the controller supplies the processing liquid from nozzle to the substrate that is held by the holder and rotated by the motor while moving the nozzle using the mover along the diametrical direction of the substrate, and
   estimates a distribution of a charge amount in the diametrical direction of the substrate based on the measurement result obtained by the gauge.

9. The substrate processing apparatus according to claim 8, comprising:
   a current supply that supplies a current in a direction opposite to the flowing current to a conduction path of the flowing current,
   wherein the controller controls an output of the current supply based on a measurement result obtained by the gauge.

10. The substrate processing apparatus according to claim 2, wherein the flowing current information includes a type of the processing liquid as the processing condition of the liquid processing, and
    the controller detects a concentration abnormality of the liquid processing based on the measurement result obtained by the gauge and the flowing current information.

11. The substrate processing apparatus according to claim 2, wherein the flowing current information includes a temperature of the processing liquid as the processing condition of the liquid processing, and
    the controller detects a temperature abnormality of the liquid processing based on the measurement result obtained by the gauge and the flowing current information.

12. The substrate processing apparatus according to claim 1, wherein the controller detects an occurrence of discharge during the liquid processing based on the measurement result obtained by the gauge.

13. The substrate processing apparatus according to claim 1, wherein the controller detects a timing at which the processing liquid on the substrate is replaced from a first processing liquid to a second processing liquid based on the measurement result obtained by the gauge.

14. The substrate processing apparatus according to claim 1, further comprising:
    a mover that moves the nozzle along a diametrical direction of the substrate,
    wherein the controller supplies the processing liquid from nozzle to the substrate that is held by the holder and rotated by the motor while moving the nozzle using the mover along the diametrical direction of the substrate, and estimates a distribution of a charge amount in the diametrical direction of the substrate based on the measurement result obtained by the gauge.

15. The substrate processing apparatus according to claim 1, further comprising:
    a current supply that supplies a current in a direction opposite to the flowing current to a conduction path of the flowing current,
    wherein the controller controls an output of the current supply based on a measurement result obtained by the gauge.

16. A substrate processing method comprising:
    providing a processing chamber including a holder configured to hold a substrate and a motor configured to rotate the substrate, a nozzle configured to eject a processing liquid, and a conductive pipe that supplies the processing liquid to the nozzle;
    holding the substrate with the holder and rotating the substrate with the motor;

supplying the processing liquid from the nozzle to the substrate while the substrate is being rotated;

measuring a flowing current generated by the processing liquid flowing through the pipe via a conduction path formed between a first wiring connected to the conductive pipe and a second wiring connected to a housing of the motor; and monitoring a liquid processing based on a measurement result obtained in the measuring.

* * * * *